US006473874B1

(12) United States Patent
Takeyama

(10) Patent No.: US 6,473,874 B1
(45) Date of Patent: Oct. 29, 2002

(54) METHOD AND SYSTEM FOR MANAGING TIMING ERROR INFORMATION

(75) Inventor: Hiroji Takeyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/431,461

(22) Filed: Nov. 1, 1999

(30) Foreign Application Priority Data

May 11, 1999 (JP) .......................................... 11-129785

(51) Int. Cl.[7] ................................................ G06F 11/00
(52) U.S. Cl. ...................................................... 714/741
(58) Field of Search ................................ 714/741, 798, 714/707; 711/716, 3, 113, 154, 159; 710/45, 58; 703/13, 23, 19, 26

(56) References Cited

U.S. PATENT DOCUMENTS

| 4,314,331 A | * | 2/1982 | Porter et al. ................. 360/200 |
| 5,231,638 A | * | 7/1993 | Fujiki .......................... 714/765 |
| 5,390,318 A | * | 2/1995 | Ramakrishnan et al. ..... 711/158 |
| 6,308,305 B1 |   | 10/2001 | Sugiyama et al. |

FOREIGN PATENT DOCUMENTS

| JP | 4-273581 | 9/1992 |
| JP | 8-221456 | 8/1996 |

* cited by examiner

*Primary Examiner*—Christine T. Tu
(74) *Attorney, Agent, or Firm*—Katten Muchin Zavis Muchin

(57) ABSTRACT

The present invention relates to a timing error information managing system. This system comprises a timing error information file, a circuit information file, a correlating section for establishing a correlation between each of timing errors in the timing error information file and each of circuit configurations in the circuit information file, and for adding a circuit information pointer to the timing error information file and further for adding an error information pointer to the circuit information file, and a managing section for managing information on timing errors through the use of the circuit information pointer and the error information pointer. This configuration allows high-efficiency management of the timing error in formation, thereby achieving the speed-up of various kinds of processing using timing error information.

44 Claims, 9 Drawing Sheets

200

METHOD AND SYSTEM FOR MANAGING TIMING ERROR INFORMATION

BACKGROUND OF THE INVENTION (1) Field of the Invention

The present invention relates to a timing error information managing method and a system, suitable for management of information on timing errors obtained through a timing check of a logical circuit in the process of design of a circuit such as an integrated circuit.

(2) Description of the Related Art

In the process of design of a circuit such as an integrated circuit, for confirming whether or not a logical circuit designed satisfies design requirements, a timing check has commonly been made through the use of a simulator, a timing analysis tool or the like to verify whether or not the time of the occurrence of an event given to a clock input terminal or data input terminal of a flip-flop of the logical circuit meets timings on a setup time and a hold time to be required in the flip-flop.

Furthermore, not only the timing error information obtained through such a timing check using the simulator or the timing analysis tool is put to use for the evaluation on the presence or absence of an error the designer makes personally, but also it is used to set a constraint for delay adjustment as disclosed in Japanese Patent Laid-Open (kokai) No. HEI 4-273581, and even it is employed for displaying an error spot emphatically through the use of a graphic display tool for circuit diagrams or the like.

The timing error information obtained through this timing check generally includes information on the start and end points of a timing check interval (section), an error type (a setup error, a hold error), an error quantity, and others. This timing error information is subjected to retrieval or the like in a manner that the start or end point serves as a key, and used for selecting and grouping errors due to the same clock, for collecting them at every start or end point, or for putting them in order by rearranging in the order of decreasing error quantity, before being put to use for the delay adjustment or the like.

Meanwhile, in general, in such a conventional timing error information managing method, of the timing error information to be obtained as the result of the timing check, a name of an element, a terminal or the like is used as the information which shows the start point or the end point of the timing check interval.

In addition, in recent years, the improvement of design engineering has caused the scale enlargement of an integrated circuit and the complication of its configuration, and a hierarchically designing technique has frequently been taken to accomplish the circuit design in subdivided units.

FIG. 10 illustratively shows one example of configuration of an integrated circuit. In FIG. 10, a circuit, denoted generally at numeral 300, has a hierarchical structure comprising three hierarchies (layers) A to C, and, for example, in designating the position of an element X on the hierarchy C of this circuit 300, the name of that element follows the names of the hierarchies described successively, like "A. B. C. X".

However, the actual integrated circuit design needs to handle circuits each having hierarchies exceeding 10 in number in many cases and to cope with complicated names of hierarchies or elements. In fact, a name consisting of more than 100 letters frequently appears at the start or end point of the timing check interval.

Thus, in such a conventional timing error information managing method, since a long name is used as the start or end point of the timing check interval, particularly, in the case that a large volume of timing error occurs, it takes a long time to retrieve or rearrange the timing error information, obtained through a simulation or the like, in a manner that its start or end point is used as a key, which deteriorates the designing efficiency.

SUMMARY OF THE INVENTION

The present invention has been developed in consideration of this problem, and it is therefore an object of this invention to provide a timing error information managing method and a system which are capable of managing timing error information with high efficiency to speed up various types of processing through the use of the timing error information.

For this purpose, in accordance with this invention, there is provided a timing error information managing method of managing information on timing errors located through a timing check of a circuit, comprising a step of reading a timing error information file storing the information on the timing errors and a circuit information file storing information on configurations of the circuit to establish a correlation between each of the timing errors in the timing error information file and each of the circuit configurations in the circuit information file, a step of adding to the timing error information file a circuit information pointer for giving an instruction regarding a position of the storage of the information on the circuit configuration, causing each of the timing errors, in the circuit information file, a step of adding to the circuit information file an error information pointer for giving an instruction regarding a position of the storage of the information on the timing error, occurring in each of the circuit configurations, in the timing error information file, and a step of managing the information on the timing errors through the use of the circuit information pointer and the error information pointer.

Furthermore, in accordance with this invention there is provided a timing error information managing system for managing information on timing errors located through a timing check of a circuit, comprising a timing error information file storing the information on the timing errors, a circuit information file storing information on configurations of the circuit, a correlating section for establishing a correlation between each of the timing errors in the timing error information file and each of the circuit configurations in the circuit information file and for adding to the timing error information file a circuit information pointer for giving an instruction regarding a position of the storage of the information on the circuit configuration, causing the occurrence of each of the timing errors, in the circuit information file and further for adding to the circuit information file an error information pointer for giving an instruction regarding a position of the storage of the information on the timing error, occurring in each of the circuit configurations, in the timing error information file, and a managing section for managing the information on the timing errors through the use of the circuit information pointer and the error information pointer.

Accordingly, in the timing error information managing method and system according to this invention, through the retrieval of the circuit information file, the error information pointer indicates the storage position of the correlating timing error registered in this circuit information file, which, even if a large quantity of timing error exists, allows a retrieval of the timing errors to be made at a high speed in

DESCRIPTION OF THE PREFERRED EMBODIMENTS (a) Description of an Aspect of this Invention First of all, an aspect of the present invention will be described hereinbelow with the reference to the drawings.

Figure 1:
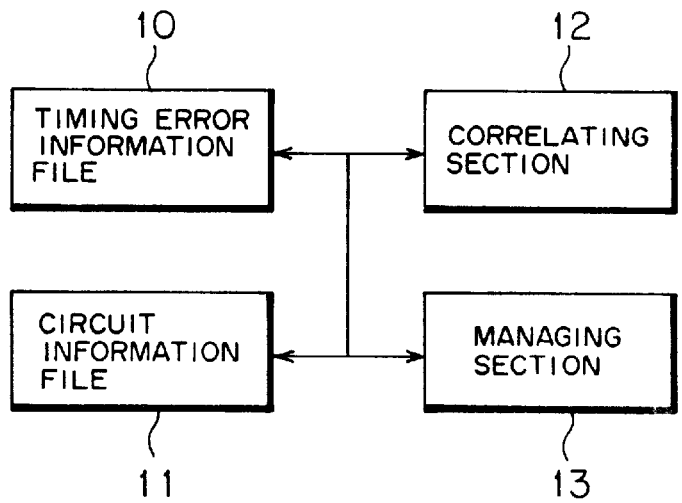
FIG. 1 is a block diagram showing an aspect of the present invention.

FIG. 1 is a block diagram showing an aspect of this invention. As FIG. 1 shows, a timing error information managing system according to this invention is for managing information on timing errors found through a circuit timing check, and is made up of a timing error information file 10, a circuit information file 11, a correlating (mapping) section 12 and a managing section 13.

The timing error information file 10 is made to store information on timing errors, while the circuit information file 11 is made to accommodate information on circuit configurations.

The correlating section 12 makes a correlation between each of the timing errors in the timing error information file 10 and each of the circuit configurations in the circuit information file 11, and additionally puts, in the timing error information file 10, a circuit information pointer for giving an instruction regarding the position of the storage of the information on the circuit configuration, where each of the timing errors occurs, in the circuit information file 11 and additionally puts, in the circuit information file 11, an error information pointer for giving an instruction regarding the position of the information on the timing error, occurring in each of the circuit configurations, in the timing error information file 10.

The managing section 13 is for managing the information on the timing errors through the use of the circuit information pointer and the error information pointer.

With this arrangement, a retrieval of the circuit information file 11 takes place so that the error -information pointer registered in this circuit information file 11 indicates the storage position of the corresponding timing error in the timing error information file 10. This means that there is no need to retrieve all the timing errors in the timing error information file 10.

For instance, in the case that 20 of 100 timing errors form error information on setup errors occurring with respect to a given clock signal, if these 20 error information are mapped in connection with the parts of the circuit information involved with that clock signal, when the timing errors related to that clock signal are selected and collected, the collection of the timing error information is achievable by using the mapping (correlation) information without retrieving all the timing error information.

Furthermore, a timing error information managing method according to this invention is for managing information on timing errors located through a timing check of a circuit, and is characterized by comprising a step of reading a timing error information file storing the information on the timing errors and a circuit information file storing information on configurations of the circuit to establish a correlation between each of the timing errors in the timing error information file and each of the circuit configurations in the circuit information file, a step of adding to the timing error information file a circuit information pointer for giving an instruction regarding a position of the storage of the information on the circuit configuration, causing each of the timing errors, in the circuit information file, a step of adding to the circuit information file an error information pointer for giving an instruction regarding a position of the storage of the information on the timing error, occurring in each of the circuit configurations, in the timing error information file, and a step of managing the information on the timing errors through the use of the circuit information pointer and the error information pointer.

Thus, in the timing error information managing method and system according to this invention, since, through the retrieval of the circuit information file, the error information pointer registered in this circuit information file indicates the storage position of the correlating timing error in the timing error information file, even if a large volume of timing error occurs, a high-speed retrieval of the timing errors becomes feasible in response to a retrieval request, which contributes to high-efficiency management of the timing error information.

Besides, the circuit information file 11 has a data signal path information file storing, as a circuit configuration, information on a data signal path for transmission of a data signal between elements constituting a circuit and a clock path information file storing, as a circuit configuration, information on a clock path for supply of a clock to each of elements organizing the circuit. In this case, the aforesaid error information pointer can also be given additionally to each of the data signal path information file and the clock path information file; hence, when a retrieval is made under a retrieval condition or requirement on the data signal path in the circuit, the retrieval can be made to only the data signal path information file and, when the retrieval is made under a retrieval condition on the clock path in the circuit, the retrieval can be made to only the clock path information file, so that the object to be retrieved is reducible, thereby enabling a higher-speed retrieval of the timing errors meeting a retrieval request and high-efficiency management of the timing error information.

Furthermore, in the case that the circuit information and the timing error information file are seen to conduct a retrieval of a timing error meeting a predetermined retrieval condition, it is also appropriate to make a correspondence between the predetermined retrieval condition and a set of the error information pointers indicative of the timing errors retrieved under this retrieval condition and to retain the correspondence therebetween as timing error selection information. This permits the effective utilization of the retrieval result once obtained.

Still further, when a timing error retrieval request taken place, it is also appropriate that a retrieval condition involved in this retrieval request is compared with the retrieval condition in the timing error selection information already retained and, if retained is the timing error selection information having the retrieval condition identical to the retrieval condition involved in the retrieval request, the set of error information pointers in this timing error selection information are outputted as the result of the retrieval made in response to the retrieval request.

Accordingly, it is possible to prevent the retrieval of the timing error information file depending upon the same retrieval condition, thus shortening the processing time.

Moreover, when a timing error retrieval request takes place, it is also appropriate that a retrieval condition involved in this retrieval request is compared with the retrieval condition in the timing error selection information already retained and, if the timing error selection information containing the retrieval condition involved in the retrieval request exists, the timing error information at which the error information pointer in that timing error selection information points is retrieved under the retrieval condition involved in the retrieval request.

Accordingly, the object to be retrieved is reducible, which enables a higher-speed retrieval of the timing errors meeting the retrieval request. There is an advantage in that the timing error information can be managed in a more efficient manner.

In addition, when a predetermined procedure is conducted through the use of a set of the error information pointers in the timing error selection information, it is also possible to rearrange the error information pointers according to an arrangement sequence condition designated.

Accordingly, the arrangement of the timing error information becomes easy so that the delay adjustment and others can be done effectively.

Besides, it is also acceptable that timing error selection information in which a correspondence is set up between a sum condition of retrieval conditions in a plurality of timing error selection information already retained and a sum set (union) of error information pointers in the plurality of timing error selection information is made as a retrieval result under the sum condition.

Accordingly, the timing error information can be managed in a more efficient manner.

Still additionally, it is also acceptable that timing error selection information is made as a retrieval result under a product condition by setting up a correspondence between a product condition of retrieval conditions in a plurality of timing error selection information already retained and a product set of error information pointers in the plurality of timing error selection information.

Accordingly, a high-speed narrowing-down retrieval of the timing errors becomes possible so that the timing error information can be managed more efficiently.

As described above, in a manner that the retrieval conditions and the retrieval results are held together, the processing of selecting a timing error fitting any one of a plurality of retrieval conditions or a timing error applying to all of a plurality of retrieval conditions is conducted only by obtaining the sum set or product set of the retrieval results already present without needing the retrieval of the whole original timing error information.

(b) Description of an Embodiment of this Invention

An embodiment of this invention will be described hereinbelow with reference to the drawings.

Figure 2:
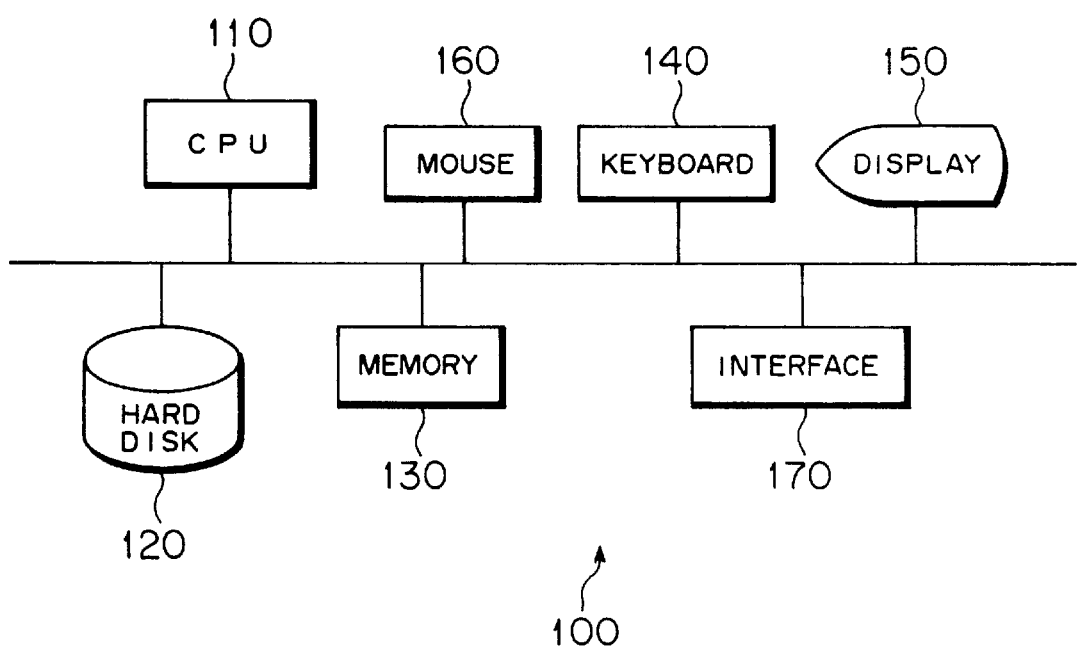
FIG. 2 is a block diagram showing the whole configuration of a timing error information managing system according to an embodiment of this invention.
Figure 3:
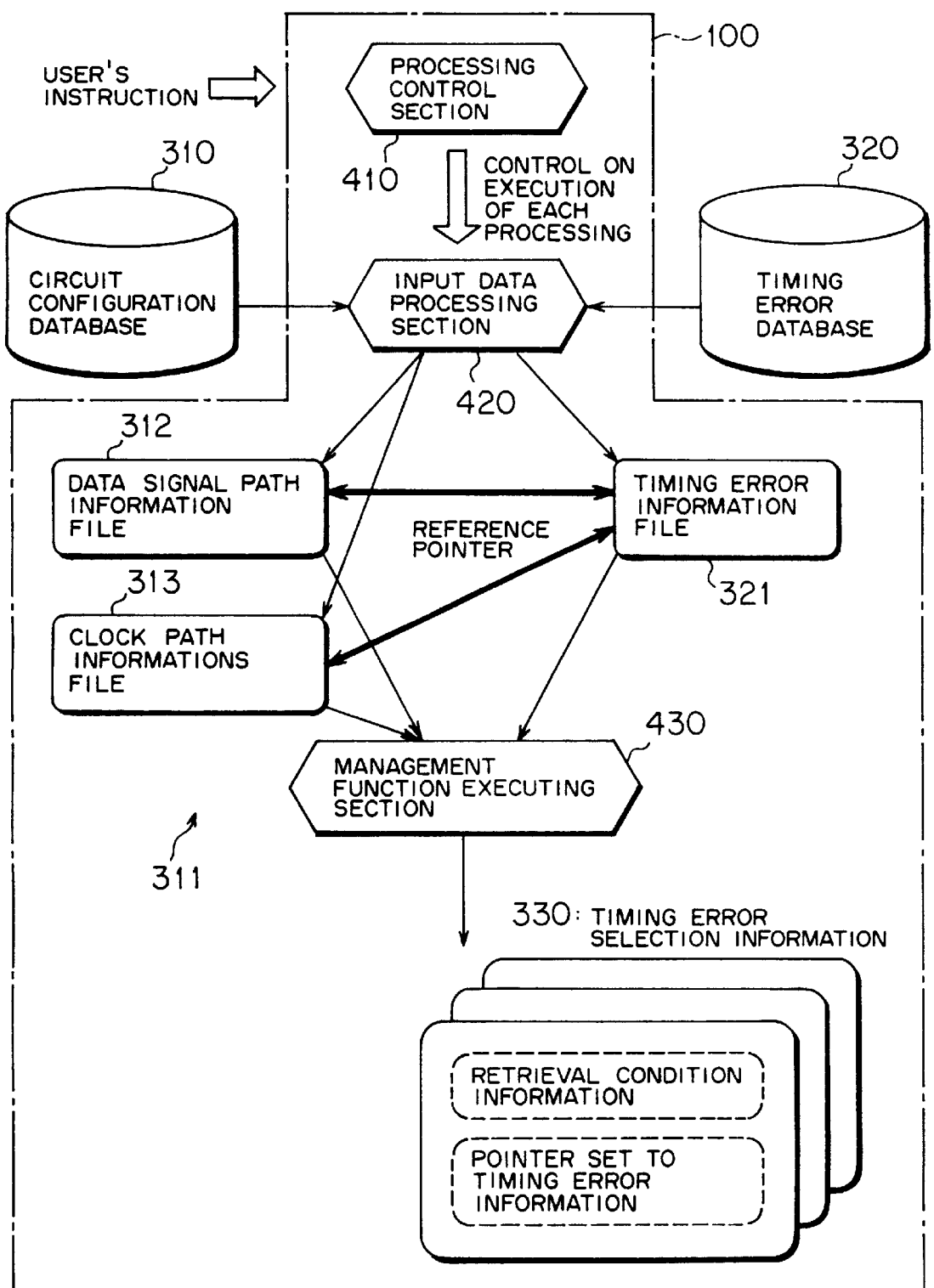
FIG. 3 is a block diagram showing a functional arrangement of the timing error information managing system according to the embodiment of this invention.
Figure 4:
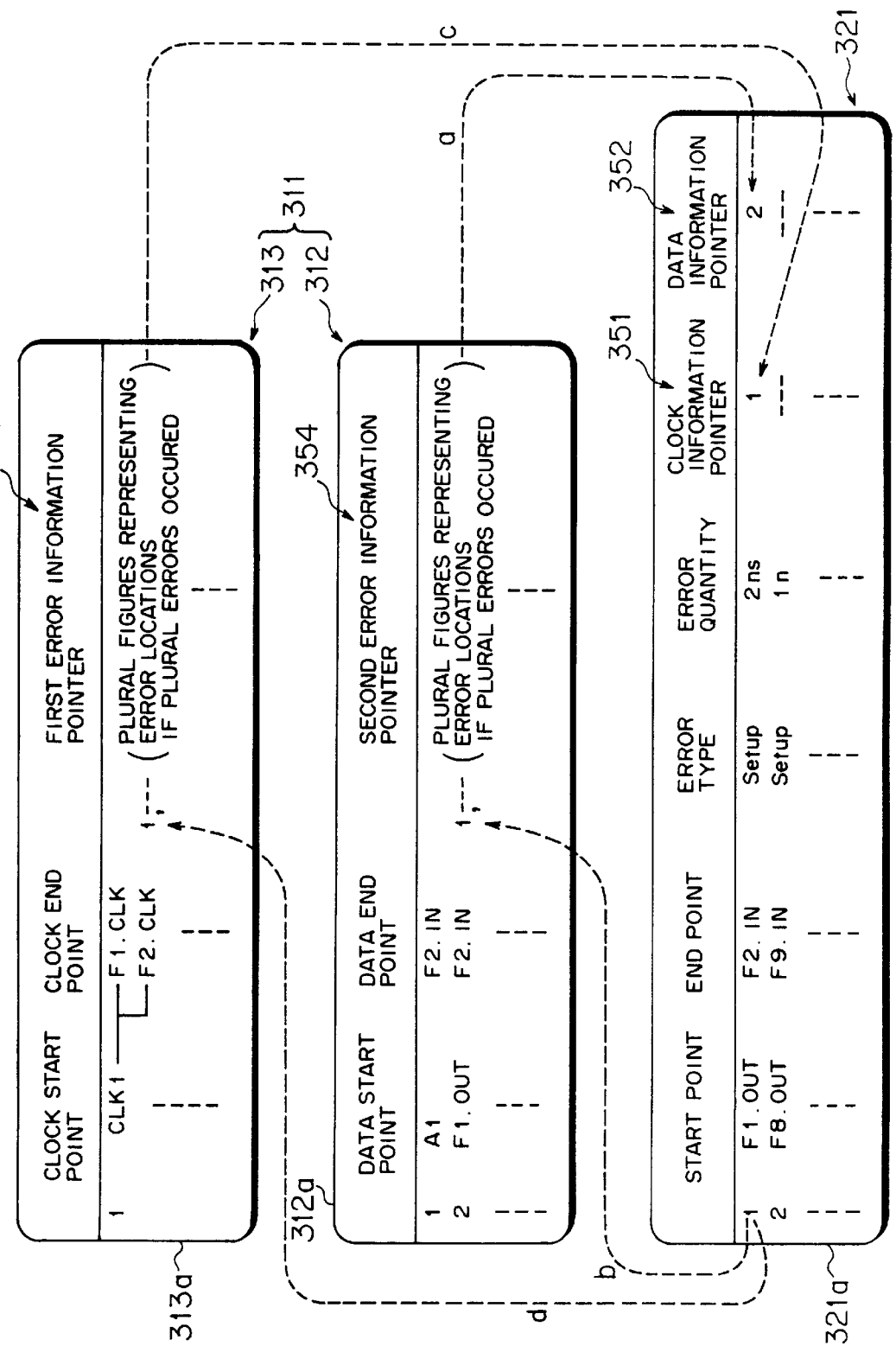
FIG. 4 is an illustration of configurations of a circuit information file and a timing error information file in this embodiment, and for describing a mapping between these files.
Figure 5:
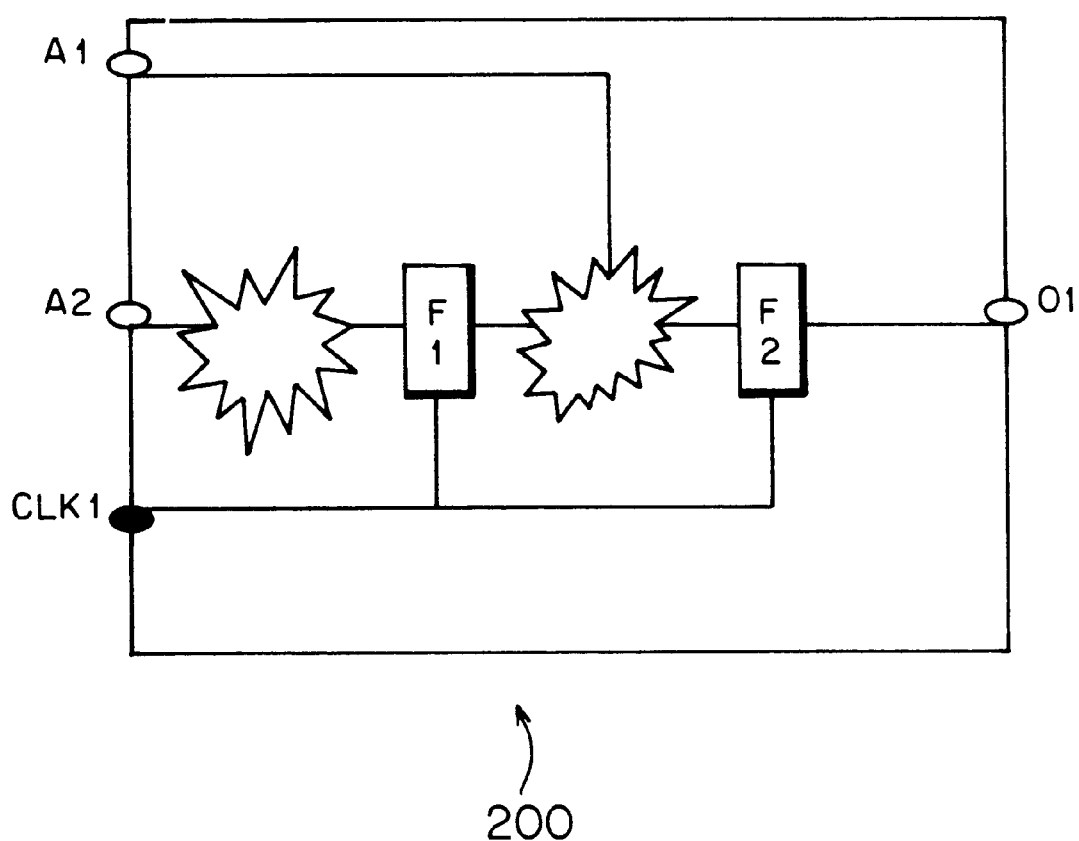
FIG. 5 illustratively shows one example of circuit undergoing a timing check.

FIGS. 2 and 3 show a configuration of a timing error information managing system according to an embodiment of this invention, with FIG. 2 being a block diagram showing the whole configuration thereof and FIG. 3 being a block diagram showing a functional configuration thereof, and FIG. 4 is an illustration of arrangements of a circuit information file and a timing error information file, and for describing the establishment of a correlation between these files in this embodiment, and further FIG. 5 illustratively shows one example of circuits undergoing a timing check.

In this embodiment, as shown in FIG. 2, a timing error information managing system, designated generally at numeral 100, is made up of a CPU 110, a hard disk (retaining section) 120, a memory (retaining section) 130, a keyboard 140, a display 150, a mouse 160, an interface 170 and a bus 180 for managing or handling information (which will be referred to hereinafter as timing error information) on timing errors located by conducting a timing check of a circuit such as an integrated circuit (which will simply be referred to hereinafter as a circuit) through the use of a simulator (not shown) or the like.

The interface 170, as shown in FIG. 3, permits the exchange of data between this timing error information managing system 100 and an timing error database 320/ circuit configuration database 310, and, for example, is constructed with communication ports or the like.

In addition, as shown in FIG. 3, this timing error information managing system 100 is made to receive a timing error information file 321 from the timing error database 320 through the interface 170 or a record medium such as a floppy disk (not shown), and to receive a circuit information file 311 from the circuit configuration database 310 therethrough.

The timing error information file 321 is made out by storing timing error information found through the circuit timing check, and functions as the timing error information file 10 shown in FIG. 1.

This timing error information file 321 is drawn up when the result of the timing check by the simulator or the like shows the detection of the fact that a signal propagation time in a specific timing check interval of the circuit deviates from an upper or lower limit value of a predetermined delay time.

In detail, the timing error information file 321 is drawn up as a data file having a specification determined in advance, and is composed of a timing error information table 321a shown in FIG. 4.

In this timing error information table 321a, as the timing error information, there are registered start and end points of a timing check interval, an error type (setup error, hold error), an error quantity, a clock information pointer (circuit information pointer) 351 and a data information pointer (circuit information pointer) 352. Incidentally, it is also possible to register a required quantity of delay and a calculated quantity of circuit delay in this timing error information table 321*a*.

The circuit information file 311 is made out by storing information on circuit configurations, and acts as the circuit information file 11 shown in FIG. 1. For example, this circuit information file 311 is drawn up from information called netlist describing the relationship in connection among circuit elements.

This circuit information file 311 is, as shown in FIGS. 3 and 4, composed of a data signal path information file 312 storing, as a circuit configuration, information on a data signal path for the transmission of a data signal among the elements constituting the circuit and a clock path information file 313 storing, as a circuit configuration, information on a clock path for the supply of a clock to each of the elements constituting the circuit.

The data signal path information file 312 has a data signal path table 312*a* shown in FIG. 4, and in this data signal path table 312*a*, as the information on the data signal path, there are registered the start point (data start point) and end point (data end point) of the data signal path in the circuit and a second error information pointer 354.

The clock path information file 313 is provided with a clock path table 313*a* shown in FIG. 4, and in this clock path table 313*a*, as the information on the clock path, there are registered the start point (clock start point) and end point (clock end point) of the clock path in the circuit and a first error information pointer 353.

Furthermore, in the columns of the data start point, data end point, clock start point and clock end point of the 19 data signal path table 312*a* and the clock path table 313*a*, there are registered the names of the elements and terminals organizing the circuit. The description of the first error information pointer 353 and the second error information pointer 354 will be given herein later.

The memory 130 shown in FIG. 2 forms an area to be used for the development of data or the like and others when the CPU 110 conducts various types of operations, and is constructed with a RAM (Random Access Memory) or the like, and is designed to retain timing error selection information 330, which will be described herein later, and others.

The hard disk 120 is for storing various types of data and others, that is, is made to store the timing error information file 321 and the circuit information file 311 (the data signal path information file 312 and the clock path information file 313). Besides, in case that, in the memory 130, a lack of its capacity arises, the hard disk 120 is designed to store the timing error selection information 330 and other under the control by the CPU 110.

The keyboard 140 and the mouse 160 serve as an inputting means to be used for when the operator inputs various kinds of instructions or performs selections and others, while the display 150 is, for example, for displaying the results of operations the CPU 110 implements.

The CPU 110 is for controlling the hard disk 120, the memory 130, the display 150, the interface 170 and others in this timing error information managing system 100, and functions as a processing control section 410, an inputted data processing section 420 and a management function implementing section 430 as shown in FIG. 3.

In this arrangement, the processing control section 410, when the operator performs various kinds of input through the use of the keyboard 140 or the mouse 160, conducts various types of processing in accordance with the contents of this input.

Furthermore, the inputted data processing section 420, in the management of the timing error information, receives the circuit information file 311 from the circuit configuration database 310 to put the data signal path information file 312 and the clock path information file 313 of the received circuit information file 311 separately in the hard disk 120, and further receives the timing error information file 321 from the timing error database 320 to put it in the hard disk 120.

Still further, the management function implementing section 430 puts the data signal path information file 312, the clock path information file 313 and the timing error information file 321 in the hard disk 120 and then makes a correlation between the timing error information file 321 and the data signal path information file 312/clock path information file 313.

Referring to FIG. 4, a description will be given hereinbelow of the correlation (mapping) in an example of the management of timing error information found through a timing check of a circuit denoted at numeral 200 in FIG. 5. In this case, the circuit 200 in FIG. 5 is composed of two flip-flops F1, F2, and these flip-flops F1, F2 is made to receive a clock signal through a clock terminal CLK1.

First, the CPU 110 (management function implementing section 430) compares the start point and the end point in the timing error information table 321*a* one by one with the data signal path (data start point and data end point; circuit configuration) in the data signal path table 312*a*.

If these start points and end points coincide with each other, as indicated by a dotted arrow line a in FIG. 4, the CPU 110 registers a storage position ("2" in FIG. 4) of the data signal path, assuming the coincidence of its start point and end point in the data signal path table 312*a*, in the column of the data information pointer 352 corresponding to the timing error assuming the coincidence of its start point and end point in the timing error information table 321*a*, and as indicated by a dotted arrow line b, registers a storage position ("1" in FIG. 4) of the timing error, showing the coincidence of its start point and end point in the timing error information table 321*a*, in the column of the second error information pointer 354 corresponding to the data signal path showing the coincidence of its start point and end point in the data signal path table 312*a*.

Thereafter, the CPU 110 makes a comparison between all the start points and end points in the timing error information table 321*a* and the data start points and data end points in the data signal path table 312*a* to conduct mutual registration processing to the data information pointer 352 and the second error information pointer 354, thereby setting up the correlation between the timing error information file 321 and the data signal path information file 312.

Secondly, the CPU 110 compares the timing errors in the timing error information table 321*a* one by one with the clock paths (circuit configurations) in the clock path table 313*a* to set up a correlation between each of the timing errors in the timing error information table 321*a* and the clock path to be related to that timing error.

If the extraction of the clock path related to a timing error takes place, as indicated by a dotted arrow line c, the CPU 110 registers the storage position ("1" in FIG. 4) of the clock path in the clock path table 313*a*, related to that timing error, in the column of the clock information pointer 351 falling under the timing error in the timing error information table 321a, and further, as indicated by a dotted arrow line d, registers the storage position ("1" in FIG. 4) of that timing error in the timing error information table 321a in the column of the first error information pointer 353 falling under the clock path related to that timing error in the clock path table 313a.

Thereafter, the CPU 110 makes a comparison between all the timing errors in the timing error information table 321a and the clock paths in the clock path table 313a to conduct the mutual registration processing to the clock information pointer 351 and the first error information pointer 353, thus establishing the correlation between the timing error information file 321 and the clock information file 313.

Besides, in the above-described processing of establishing the correlation between the timing error information file 321 and the data signal path information file 312/clock path information file 313, if a plurality of corresponding timing errors exist in the timing error information file 321, a plurality of positions thereof are registered in the first error information pointer 353 and the second error information pointer 354.

In this way, the CPU 110 (management function executing section 430) conducts the correlation between the timing errors in the timing error information file 321 and the circuit configurations in the circuit information file 311 (the data signal path information file 312 and the clock path information file 313), and additionally gives, to the timing error information file 321, the circuit information pointer (clock information pointer 351, the data information pointer 352) indicative of the storage position of the information on the circuit configuration, causing each of the timing errors, in the circuit information file 311, while additionally gives, to the circuit information file 311 (the data signal path information file 312 and the clock path information file 313), the error information pointer (the first error information pointer 352, the second error information pointer 353) indicative of the storage position of the information on the timing error, occurring in each of the circuit configurations, in the timing error information file 321, thus functioning as the correlating section 12 shown in FIG. 1.

Furthermore, consulting the timing error information file 321, the CPU 110 (the management function executing section 430) conducts the timing error retrieval conforming to a retrieval condition, the operator inputs through the use of the keyboard 140 or the mouse 160, to the timing error information file 321, the data signal path information file 312 and the clock path information file 313 mapped through the clock information pointer 351, the data information pointer 352, the first error information pointer 353 and the second error information pointer 354.

In this case, the CPU 110 (the management function executing section 430) is made to manage the timing error information through the use of the clock information pointer 351, the data information pointer 352, the first error information pointer 353 and the second error information pointer 354, and also functions as the managing section 13 as shown in FIG. 1.

Concretely, in this timing error information managing system 100, in the case that, for example, the retrieval of the timing error information file 321 is performed for "the timing error detected by the flip-flops which take synchronizing relation to each other due to a signal inputted through a clock terminal referred to as CLK1", the operator inputs the retrieval condition of "clock start point is CLK1" through the use of the keyboard 140 or the mouse 160 for this retrieval processing.

The CPU 110 retrieves the information falling under the condition "clock start point is CLK1" (corresponding to "1" in FIG. 4) from the clock path table 313a stored in the clock path information file 313, and refers to the information (the storage position of the timing error in the timing error information file 321; corresponding to "1, . . . " in FIG. 4) the first error information pointer 353 corresponding thereto indicates.

In addition, the CPU 110 (the management function executing section 430), as shown in FIG. 3, makes the correspondence between the retrieval condition (for example, "clock start point is CLK1") inputted through the keyboard 140 or the mouse 160 and a set of the first error information pointers 353 indicating the timing error information retrieved under this retrieval condition, and retains the correspondence as the timing error selection information 330 in the memory 130.

If a memory capacity enough to retain this timing error selection information 330 is absent in the memory 130, the CPU 110 implements control so that this timing error selection information 330 is preserved in the hard disk 120.

Still additionally, the CPU 110 (management function executing section 430) confirms the storage position of the timing error under the inputted retrieval condition in the timing error information file 321 on the basis of the information (the timing error position in the timing error information file 321) residing in the first error information pointer 353 to display that timing error information as the retrieval result on the display 150 or to print it out through the use of a printer (not shown).

Besides, if the inputted retrieval condition does not depend upon the circuit configurations, for example, in the case of a condition like "the quantity of timing error exceeds 1 ns" which is not included in the circuit information file 311 (the data signal path information file 312 and the clock path information file 313), the timing error information table 321a is retrieved directly, and this retrieval condition and a set of the error information pointers (353, 354) representative of the position of the timing error retrieved under this retrieval condition in the timing error information file 321 are preserved as the timing error selection information 330 in the memory 130.

Besides, in the following description, the first error information pointer 353 and the second error information pointer 354 in the timing error selection information 330 will sometimes be referred to as a timing error information pointer.

Furthermore, when receiving a timing error retrieval request, the CPU 110 (the management function executing section 430) compares the retrieval condition involved in this retrieval request with the retrieval condition in each of the timing error selection information 330 retained in the memory 130 or the like, and if the timing error selection information 330 having the retrieval condition identical to the retrieval condition involved in the retrieval request is retained in the memory 130 or the like, outputs a set of the error information pointers in this timing error selection information 330 as the result of the retrieval made in response to the retrieval request without retrieving the timing error information file 321.

Figure 6:
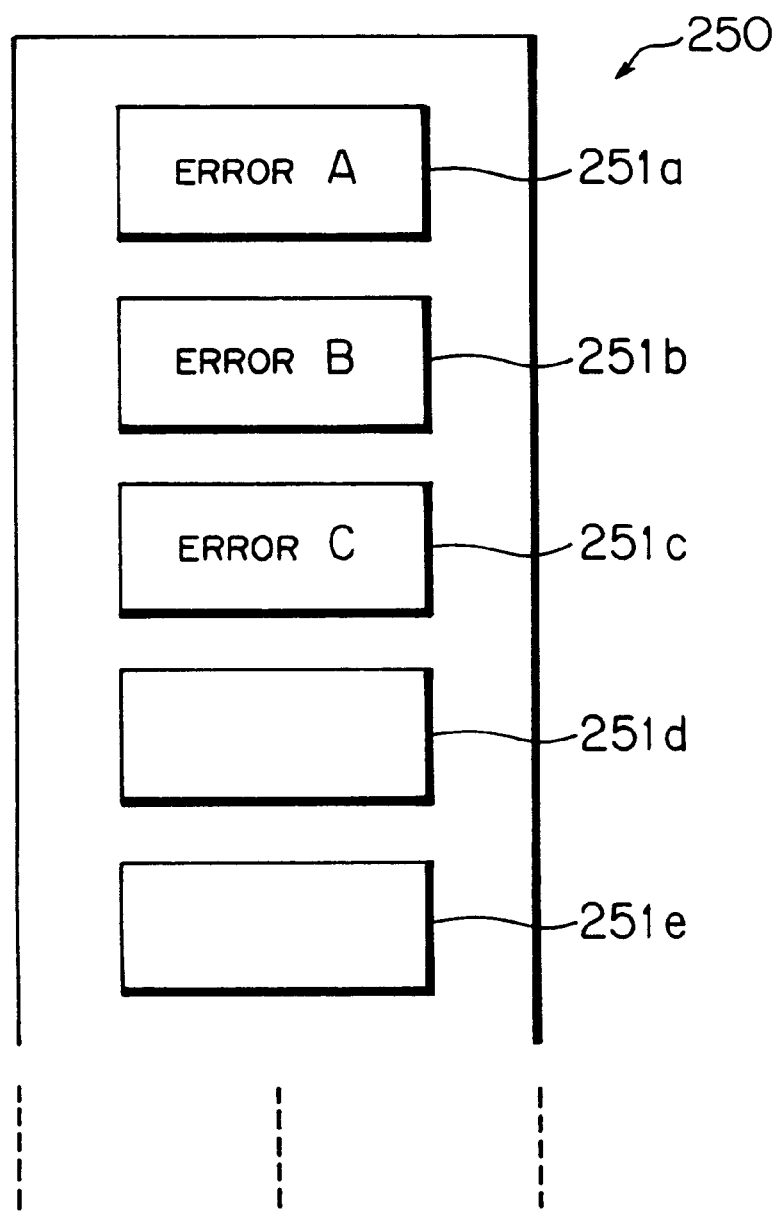
FIG. 6 is an illustration of an example of indication of a retrieval table on a display in the timing error information managing system according to the embodiment of this invention.

FIG. 6 is an illustration of a displaying example of a retrieval table 250 on the display 150. In this timing error information managing system 100, the CPU 110 (the management function executing section 430) indicates, on the display 150, the timing error selection information 330, preserved in the memory 130 or the like, in the form of icons 251a to 251e disposed in the retrieval table 250 as shown in FIG. 6.

This retrieval table 250 is composed of the icons 251a to 251e drawn up at every timing error selection information 330, and each of these icons 251a to 251e indicates a retrieval condition in the timing error selection information 330.

In preserving the timing error selection information 330 in the memory 130 or the like, the CPU 110 (the management function executing section 430) makes out the icons 251a to 251e corresponding to that timing error selection information 330 in the retrieval table 250, while the operator selects one of the icons 251a to 251e in the retrieval table 250 according to a desired retrieval condition, thereby performing the indication of the retrieval result corresponding to that timing error selection information 330 on the display 150 or conducting the printing thereof through a printer (not shown).

Moreover, upon a receipt of a timing error retrieval request, the CPU 110 (the management function executing section 430) compares the retrieval condition involved in that retrieval request with the retrieval conditions in the timing error selection information 330 retained in the memory 130 or the like, and if the timing error selection information 330 having the retrieval condition covering the retrieval condition involved in the retrieval request is retained in the memory 130 or the like, performs the retrieval under the retrieval condition involved in the retrieval request for the timing error indicated by a set of the error information pointers in that timing error selection information 330.

Besides, in conducting predetermined processing by using a set of error information pointers in the timing error selection information 330, the CPU 110 (the management function executing section 430) is designed to be capable of rearranging these information pointers according to a designated arrangement sequence condition (for example, in the order of decreasing error quantity).

In addition, the CPU 110 (the management function executing section 430) is made to be capable of drawing up, as the retrieval result under a sum condition, the timing error selection information 330 in which the sum condition of retrieval conditions in a plurality of timing error selection information 330 retained is in corresponding relation to a sum set of error information pointers in the plurality of timing error selection information 330, thereby, when a plurality of timing error selection information 330 is retained in the memory 130 or the like, making out the timing error selection information 330 falling under the sum condition of the retrieval conditions in the plurality of timing error selection information.

Still additionally, the CPU 110 (the management function executing section 430) is made to be capable of drawing up, as the retrieval result under a product condition, the timing error selection information 330 in which a product condition of retrieval conditions in a plurality of timing error selection information 330 preserved in the memory 130 or the like is in corresponding relation to a product set of error information pointers in the plurality of timing error selection information 330, thereby, when a plurality of timing error selection information 330 is preserved in the memory 130 or the like, making out the timing error selection information 330 falling under the product condition of the retrieval conditions in the plurality of timing error selection information 330.

Referring to the flow charts of FIGS. 7 to 9, a description will be given hereinbelow of a method of managing timing error information in the timing error information managing system 100 thus arranged according to the embodiment of this invention.

Figure 7:
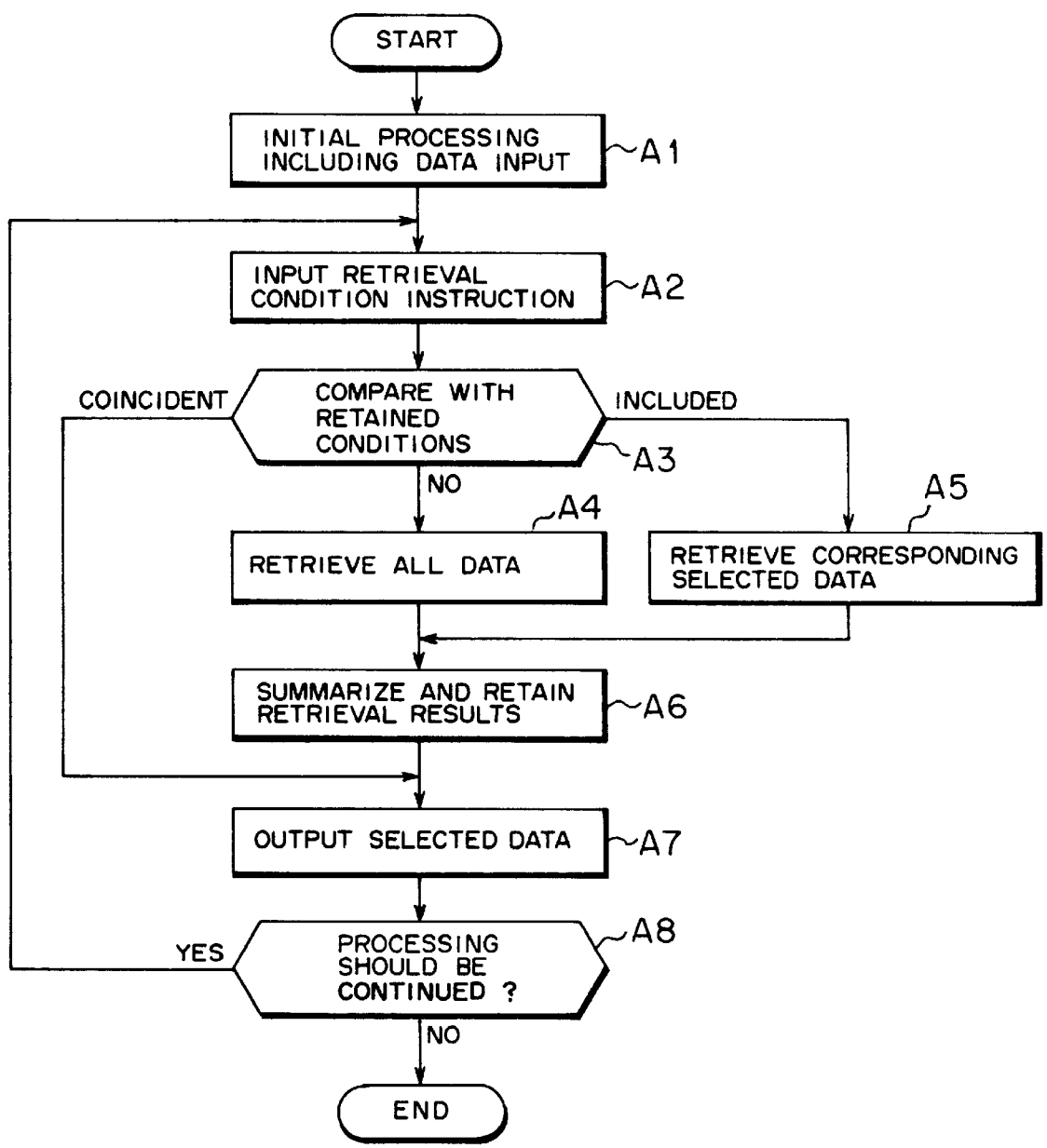
FIG. 7 is a flow chart useful for explaining a timing error information managing method to be taken in the timing error information managing system according to the embodiment of this invention.
Figure 8:
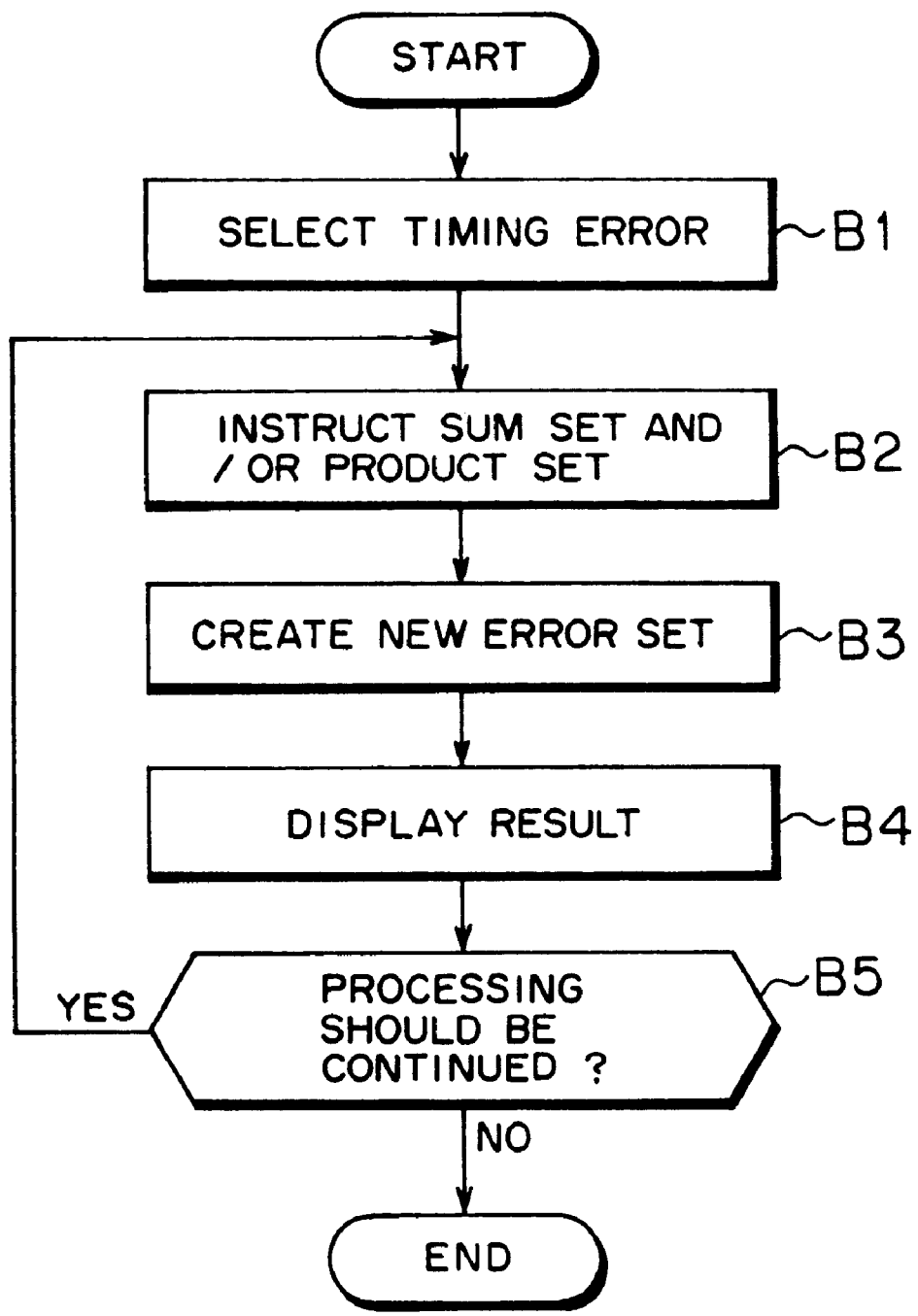
FIG. 8 is a flow chart available for explaining a process of making a retrieval under a sum condition or a product condition of retrieval conditions in a timing error selection information in the timing error information managing system according to the embodiment of this invention.
Figure 9:
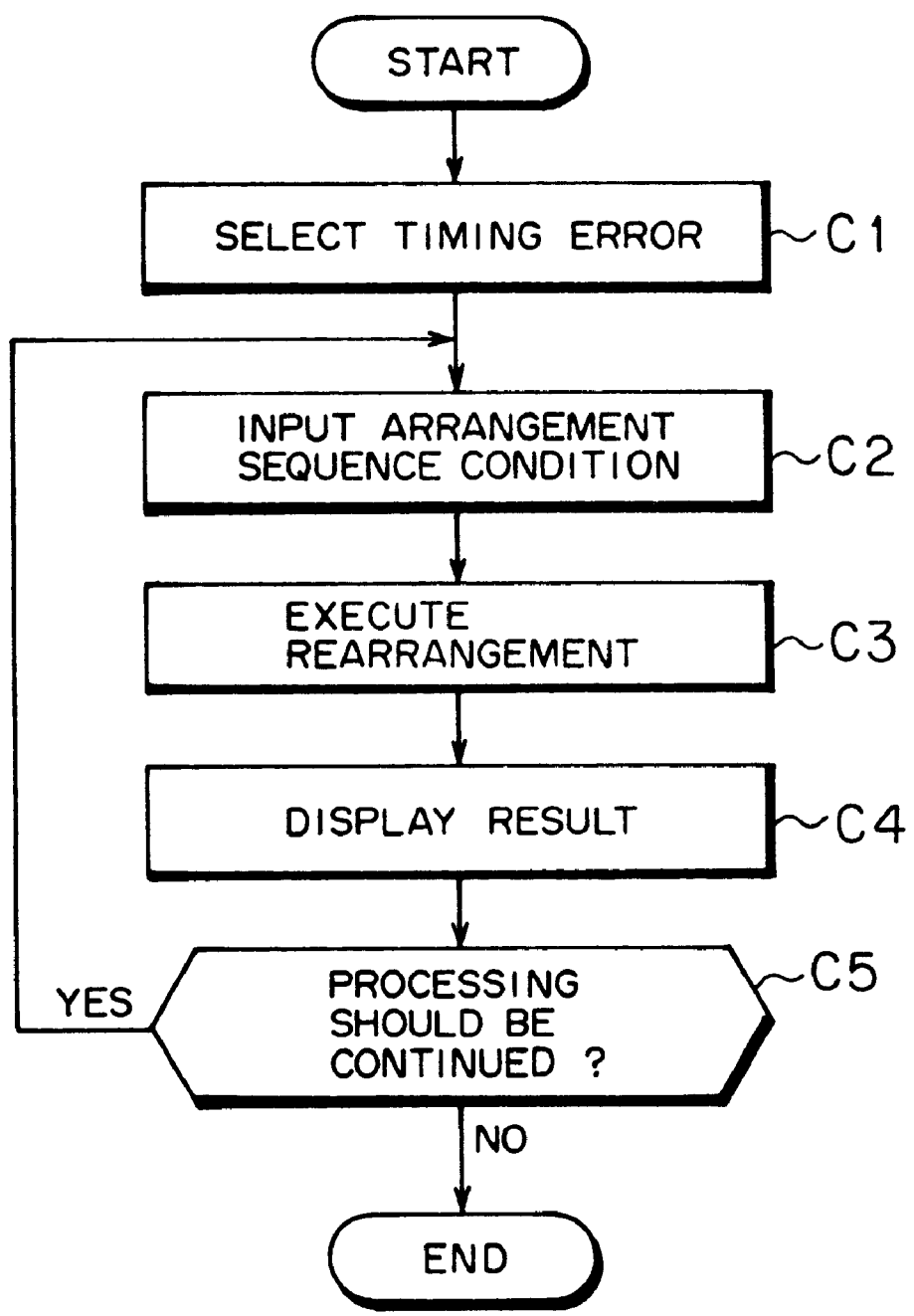
FIG. 9 is a flow chart available for describing a process of rearranging timing error information in the timing error information managing system according to the embodiment of this invention.
Figure 10:
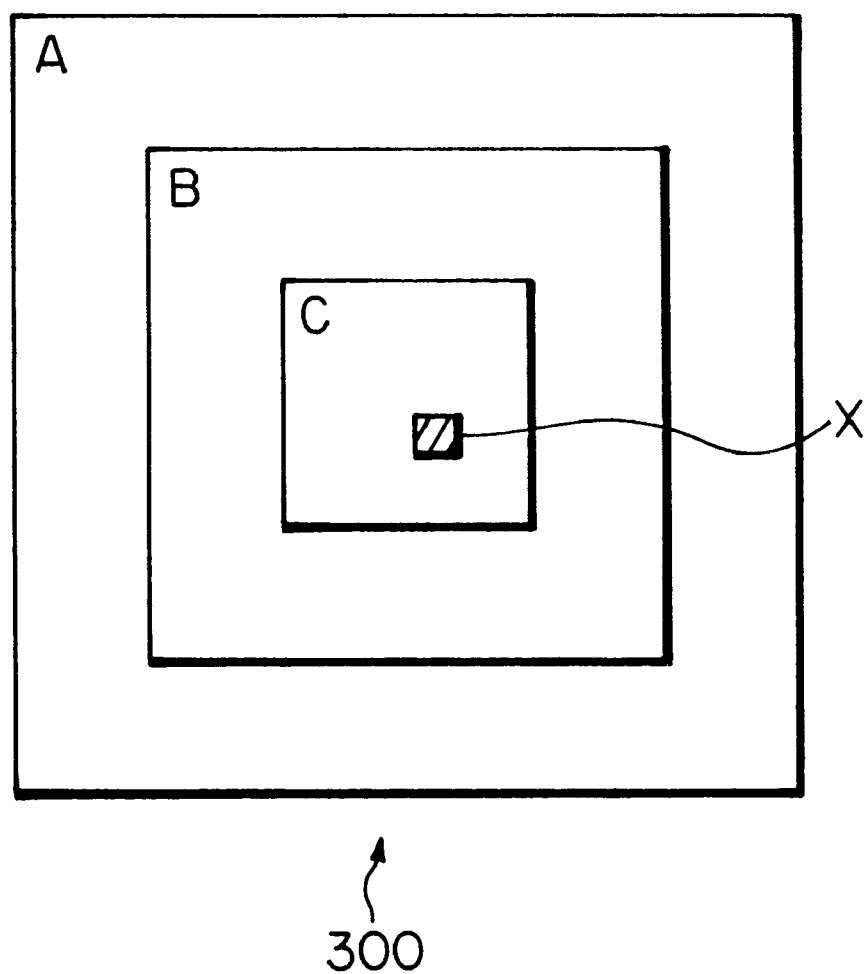
FIG. 10 illustratively shows one example of configuration of an integrated circuit.

FIG. 7 is a flow chart (steps A1 to A8) for describing a timing error information managing method in the timing error information managing system 100 according to the embodiment of this invention, FIG. 8 is a flow chart (steps B1 to B5) for describing a procedure of retrieval under a sum condition or a product condition in the timing error selection information 330, and FIG. 9 is a flow chart (steps C1 to C5) for explaining a procedure of rearranging timing error information.

In the case that a timing check of a circuit is made through the use of a simulator or the like and the timing error information thus obtained is managed in this timing error information managing system 100, as shown in FIG. 7, the CPU 110 first receives, through the interface 170 or the like, the timing error information file 321 made out by the simulator or the like and retained in the timing error database 320 and the circuit information file 311 of a circuit timing-checked and preserved in the circuit configuration database 310 to conduct the correlating between these files (step A1).

That is, the CPU 110 divides the received circuit information file 311 into the data signal path information file 312 and the clock path information file 313 and stores them together with the timing error information file 321 in the hard disk 120, and then establishes a correlation among the timing error information file 321, the data signal path information file 312 and the clock path information file 313 through the use of the first error information pointer 353, the second error information pointer 354, the clock information pointer 351 and the data information pointer 352 as described above with reference to FIG. 4.

Furthermore, if the operator inputs a retrieval instruction together with a retrieval condition through the keyboard 140 or the mouse 160 (step A2), this inputted retrieval condition is compared with the retrieval condition in the timing error selection information 330 stored in the memory 130 (step A3).

At this time, if a condition coincident with or including the retrieval condition inputted through the keyboard 140 or the mouse 160 does not exist as one of the retrieval conditions in the timing error selection information 330 accommodated in the memory 130 (see "NO" route from the step A3), a retrieval under the inputted retrieval condition is made over all the timing error information in the timing error information file 321 (step A4).

Furthermore, the CPU 110 establishes a correspondence between the inputted retrieval condition and the first error information pointer 353/second error information pointer 354 indicating the timing errors retrieved under this retrieval condition to retain the correspondence as the timing error selection information 330 in the memory 130 (step A6).

Still further, the CPU 110 confirms the storage position of the timing error, falling under the inputted retrieval condition, in the timing error information file 321 on the basis of the information residing in the first error information pointer 353 and the second error information pointer 354 (the position of the timing error in the timing error information file 321) to put, on the display 150, the timing error information or the like lying at the position, the error information pointer indicates in the timing error information file 321, as the retrieval result or to make a printer (not shown) print it (step A7).

On the other hand, if a condition including the retrieval condition inputted through the keyboard 140 or the mouse 160 exists as one of the retrieval conditions in the timing error selection information 330 stored in the memory 130 (see "INCLUDING" route from the step A3), the retrieval under the retrieval condition inputted through the keyboard 140 or the mouse 160 is made on the timing error, indicated by a set of error information pointers representing the retrieval condition, in that timing error selection information 330 (step A5), which is followed by the processing of the step A6 and the step A7.

For instance, by the detection of the timing error information between flip-flops (which will sometimes be referred to as FFs) which are in synchronizing relation due to a signal inputted from a clock terminal referred to as CLK1, in the case the timing error selection information 330 having a retrieval condition of "clock start point is CLK1" is already stored in the memory 130, and for the retrieval on "setup error that error quantity exceeds 1 ns between FFs being in synchronizing relation due to a signal inputted from a clock terminal referred to as CLK1", in place of the retrieval of all the timing errors in the timing error information file 321 under the retrieval condition of "setup error that error quantity exceeds 1 ns between FFs being in synchronizing relation due to a signal inputted from a clock terminal referred to as CLK1", a retrieval is made on the timing error information indicated by a set of the error information pointers in the timing error selection information 330, having the retrieval condition of "clock start point is CLK1", under the retrieval condition of "setup error that error quantity exceeds 1 ns".

On the other hand, in the case that a condition coincident with the retrieval condition inputted through the keyboard 140 or the mouse 160 resides as one of the retrieval conditions in the timing error selection information 330 stored in the memory 130 (see "COINCIDENT" route from the step A3), the timing error information indicated by a set of the error information pointers corresponding to that retrieval condition in the timing error selection information 330 is displayed as the retrieval result on the display 150 or is printed through the use of a printer (not shown) (step A7).

After the indication of the retrieval result on the display 150 or the other processing thereof, a confirmation is made as to whether or not to further conduct the retrieval on the timing error information (step A8), and if conducting a further retrieval (see "YES" route from step A8), the step A2 and the following steps are implemented repeatedly. On the other hand, if not conducting the retrieval (see "NO" route from step A8), this operational flow directly comes to an end.

Moreover, this timing error information managing system 100 is designed to be also capable of retrieving timing errors under a sum condition or a product condition of the retrieval conditions in the timing error selection information 330 drawn up through retrieval, and a description will be made hereinbelow of this retrieving method.

First, the timing error information file 321 to be retrieved is selected and a retrieval condition for the retrieval under a sum condition or a product condition is selected from a plurality of timing error selection information 330 corresponding to the timing error information file 321 (step B1).

For this selection of the retrieval condition, for example, as shown in FIG. 6, a plurality of icons 251a to 251e representing a desired retrieval condition are selected from the retrieval table 250 appearing on the display 150.

Following this, when receiving an instruction for making out a sum set or a product set (step B2), the CPU 110 draws up, as new timing error selection information 330, timing error selection information in which a correspondence is established between the sum condition or the production condition of the retrieval conditions in a plurality of timing error selection information 330 selected and the sum set or the product set of the error information pointers in the plurality of timing error selection information 330, and preserves the correspondence relation in the memory 130 (step B3).

For instance, in the case of the management of timing error information about a circuit divided into a plurality of blocks, if the memory 130 retains the timing error selection information 330 having the retrieval condition of "FF residing in C block" and the timing error selection information 330 having the retrieval condition of "clock start point is CLK1", timing error selection information 330 is drawn up so that, in these two timing error selection information 330, the product condition of the retrieval conditions assumes correspondence relation to the product set of the error information pointers, thereby collecting the timing errors falling under the retrieval condition of "timing error is about FF in C block, and clock start point is CLK1".

Furthermore, the CPU 110 puts the timing error information, indicated by the error information pointer corresponding to that retrieval condition in the timing error selection information 330, as the retrieval result on the display 150 or pints it by using a printer (not shown) (step B4).

After the indication of the retrieval result on the display 150 or the other processing thereof, a confirmation is made as to whether or not to further conduct the retrieval or the like on that timing error information (step B5), and if conducting a further retrieval (see "YES" route from step B5), the step B2 and the following steps are implemented repeatedly. On the other hand, if not conducting the retrieval (see, "NO" route from step B5), this operational flow directly comes to an end.

In addition, in this timing error information managing system 100, the CPU 110 is made to be capable of rearranging the error information pointers in the timing error selection information 330 according to a designated arrangement sequence condition, so that the timing error information can be rearranged in a desired order, for example, for when the timing error set retrieved as described above is put on the display 150.

Concretely, as shown in FIG. 9, after the selection of the timing error selection information 330 undergoing the rearrangement (step C1), a desired arrangement sequence condition is inputted through the keyboard 140 or the mouse 160 (step C2).

In this case, the arrangement sequence condition to be inputted includes, for example, indicating the start points or the end points in alphabetical order and displaying in the order of decreasing error quantity.

The CPU 110 rearranges the error information pointers in the timing error selection information 330 according to this inputted arrangement sequence condition (step C3), and outputs the rearrangement result to the display 150 or the like (step C4).

After outputting the retrieval result to the display 150 or the like, the CPU 110 confirms whether or not to further perform the rearrangement for the timing error information (step C5). If further conducting the rearrangement (see "YES" route from the step C5), the step C2 and the following steps are conducted repeatedly. On the other hand, if not conducting the rearrangement (see "NO" route from the step C5), the operational flow terminates directly.

As described above, in the timing error information managing method and system according to the embodiment of this invention, the timing errors in the timing error information file 321 are made to correlate to the circuit configurations in the circuit information file 311, and when a retrieval of the timing errors is made under a predetermined retrieval condition on a circuit configuration, the circuit information file 311 is retrieved so that the storage position of the corresponding timing error in the timing error information file 321 is indicated by the error information pointers (the first error information pointer 353, the second error information pointer 354). Accordingly, even if a large quantity of timing error arises, the timing error retrieval is achievable at a high speed in response to a retrieval request, which allows high-efficiency management of timing error information.

In addition, since the circuit information file 311 is divided into the data signal path information file 312 and the clock path information file 313 which in turn are made to have a correlating relation to the timing error information file 321, in the case that a retrieval is made under a retrieval condition on a data signal path in a circuit, the data signal path information file 312 is retrieved, and in the case that a retrieval is made under a retrieval condition on a clock path in the circuit, the clock path information file 313 is retrieved, which contributes to reduction of the object to be retrieved, thereby permitting higher-speed retrieval of the timing errors meeting a retrieval request and a high-efficiency management of the timing error information.

Still additionally, since a correspondence is set up between a retrieval condition inputted through the keyboard 140 or the mouse 160 and a set of error information pointers (the first error information pointer 353, the second error information pointer 354) indicating the timing error information retrieved under this retrieval condition and is retained as the timing error selection information 330, it is possible to effectively utilize the retrieval result produced once.

That is, when receiving a timing error retrieval request, the CPU 110 compares the retrieval condition involved in that retrieval request with the retrieval condition in each of the timing error selection information 330 preserved in the memory 130 or the like, and if the timing error selection information 330 having the retrieval condition identical to the retrieval condition involved in the retrieval request is preserved in the memory 130 or the like, a set of the error information pointers in that timing error selection information 330 is outputted as the retrieval result meeting the retrieval request without retrieving the timing error information file 321, so that there is no need to conduct the retrieval under the same retrieval condition, thus shortening the processing time.

In addition, in the case that the timing error selection information 330 having a retrieval condition containing the retrieval condition involved in the retrieval request is retained in the memory 130 or the like, since a retrieval under the retrieval condition involved in the retrieval request is made on the timing error indicated by a set of the error information pointers in that timing error selection information 330, the object to be retrieved is reducible, which contributes to higher-speed timing error retrieval meeting the retrieval request and to high-efficiency management of timing error information.

Furthermore, in conducting predetermined processing through the use of a set of the error information pointers in the timing error selection information 330, the CPU 110 can rearrange these error information pointers in a designated arrangement sequence condition; whereupon the arrangement of the timing error information becomes easy and the delay adjustment or the like becomes feasible with high efficiency.

Still further, the CPU 110 can produce, as the retrieval result under a sum condition, the timing error selection information 330 in which a correspondence is established between the sum condition of the retrieval conditions in a plurality of timing error selection information 330 retained in the memory 130 or the like and a sum set of the error information pointers in the plurality of timing error selection information 330, thereby enabling higher-efficiency management of the timing error information.

Moreover, the CPU 110 can produce, as the retrieval result under a product condition, the timing error selection information 330 in which a correspondence is established between a product condition of the retrieval conditions in a plurality of timing error selection information 330 retained in the memory 130 or the like and a product set of the error information pointers in the plurality of timing error selection information 330, thereby enabling high-speed narrowing-down retrieval of the timing error information and higher-efficiency management of the timing error information.

Although in the above-described embodiment the timing error information file 321 or the circuit information file 311 is received from the timing error database 320 or the circuit configuration database 310, this invention is not limited to this, but it is also appropriate that the timing error information managing system 100 is equipped with a function of a simulator and a circuit timing check is made in the timing error information managing system 100 to make out the timing error information file 321 or the circuit information file 311.

Furthermore, although in the above-described embodiment the timing error information file 321 or the circuit information file 311 is received from the external timing error database 320 or the circuit configuration database 310 through the interface 170, a floppy disk or the like, this invention is not limited to this, but it is also possible that, for example, the timing error database 320 and the circuit configuration database 310 are preserved on a hard disk or the like in the same computer system.

Still further, as another embodiment, this invention is also applicable to a system in which, in a manner that a circuit alteration to shorten or lengthen the delay time is made while maintaining the logical identity of the circuit on the basis of timing error information, timing error information is managed in the interior of a timing adjustment program device which eliminates timing errors. In this case, the operator does not input a command for managing timing error information through the use of the keyboard 140 or the mouse 160, but a timing adjustment program conducts the processing such as the acquisition of necessary timing error information and the exclusion of timing errors settled.

It should be understood that the present invention is not limited to the above-described embodiment, and that it is intended to cover all changes and modifications of the embodiment of the invention herein which do not constitute departures from the spirit and scope of the invention.

What is claimed is:

1. A timing error information managing method of managing information on timing errors located through a timing check of a circuit, comprising the steps of:

reading a timing error information file storing said information on said timing errors and a circuit information file storing information on configurations of said circuit;

establishing a correlation between each of said timing errors in said timing error information file and each of said circuit configurations in said circuit information file;

adding, to said timing error information file, a circuit information pointer for giving an instruction regarding a position of the storage of said information on said circuit configuration, causing each of said timing errors, in said circuit information file;

adding, to said circuit information file, an error information pointer for giving an instruction regarding a position of the storage of said information on said timing error, occurring in each of said circuit configurations, in said timing error information file; and managing said information on said timing errors through the use of said circuit information pointer and said error information pointer.

2. A timing error information managing method as defined in claim 1, wherein said circuit information file includes a data signal path information file storing, as said circuit configuration, information on a data signal path for transmission of a data signal among elements constituting said circuit and a clock path information file storing, as said circuit configuration, information on a clock path for supply of a clock to each of said elements constituting said circuit, and said error information pointer is added to each of said data signal path information file and said clock path information file.

3. A timing error information managing method as defined in claim 2, wherein, when a timing error retrieval conforming to a predetermined retrieval condition is made referring to said circuit information file and said timing error information file, a correlation is established between said predetermined retrieval condition and a set of error information pointers indicating said timing errors retrieved under said predetermined retrieval condition, and is retained as timing error selection information.

4. A timing error information managing method as defined in claim 3, wherein, upon a receipt of a timing error retrieval request, a retrieval condition involved in said retrieval request is compared with a retrieval condition in said timing error selection information already retained, and if said timing error selection information containing said retrieval condition identical to said retrieval condition involved in said retrieval request is retained, a set of error information pointers in said timing error selection information is outputted as a result of a retrieval meeting said retrieval request.

5. A timing error information managing method as defined in claim 4, wherein, upon a receipt of a timing error retrieval request, a retrieval condition involved in said retrieval request is compared with a retrieval condition in said timing error selection information already retained, and if said timing error selection information containing a retrieval condition including said retrieval condition involved in said retrieval request is retained, a retrieval under said retrieval condition involved in said retrieval request is conducted on timing error information indicated by an error information pointer in said timing error selection information.

6. A timing error information managing method as defined in claim 5, wherein, when predetermined processing is conducted through the use of said set of error information pointers in said timing error selection information, said error information pointers are rearranged according to an arrangement sequence condition designated.

7. A timing error information managing method as defined in claim 4, wherein, when predetermined processing is conducted through the use of said set of error information pointers in said timing error selection information, said error information pointers are rearranged according to an arrangement sequence condition designated.

8. A timing error information managing method as defined in claim 3, wherein, upon a receipt of a timing error retrieval request, a retrieval condition involved in said retrieval request is compared with a retrieval condition in said timing error selection information already retained, and if said timing error selection information containing a retrieval condition including said retrieval condition involved in said retrieval request is retained, a retrieval under said retrieval condition involved in said retrieval request is conducted on timing error information indicated by an error information pointer in said timing error selection information.

9. A timing error information managing method as defined in claim 8, wherein, when predetermined processing is conducted through the use of said set of error information pointers in said timing error selection information, said error information pointers are rearranged according to an arrangement sequence condition designated.

10. A timing error information managing method as defined in claim 3, wherein, when predetermined processing is conducted through the use of said set of error information pointers in said timing error selection information, said error information pointers are rearranged according to an arrangement sequence condition designated.

11. A timing error information managing method as defined in claim 3, wherein timing error selection information in which a correlation is established between a sum condition of retrieval conditions in a plurality of timing error selection information already retained and a sum set of error information pointers in said plurality of timing error selection information is drawn up as a retrieval result under said sum condition.

12. A timing error information managing method as defined in claim 3, wherein timing error selection information in which a correlation is established between a product condition of retrieval conditions in a plurality of timing error selection information already retained and a product set of error information pointers in said plurality of timing error selection information is drawn up as a retrieval result under said product condition.

13. A timing error information managing method as defined in claim 1, wherein, when a timing error retrieval conforming to a predetermined retrieval condition is made referring to said circuit information file and said timing error information file, a correlation is established between said predetermined retrieval condition and a set of error information pointers indicating said timing errors retrieved under said predetermined retrieval condition, and is retained as timing error selection information.

14. A timing error information managing method as defined in claim 13, wherein, upon a receipt of a timing error retrieval request, a retrieval condition involved in said retrieval request is compared with a retrieval condition in said timing error selection information already retained, and if said timing error selection information containing said retrieval condition identical to said retrieval condition involved in said retrieval request is retained, a set of error information pointers in said timing error selection information is outputted as a result of a retrieval meeting said retrieval request.

15. A timing error information managing method as defined in claim 14, wherein, upon a receipt of a timing error retrieval request, a retrieval condition involved in said retrieval request is compared with a retrieval condition in said timing error selection information already retained, and if said timing error selection information containing a retrieval condition including said retrieval condition involved in said retrieval request is retained, a retrieval under said retrieval condition involved in said retrieval request is conducted on timing error information indicated by an error information pointer in said timing error selection information.

16. A timing error information managing method as defined in claim 15, wherein, when predetermined processing is conducted through the use of said set of error information pointers in said timing error selection information, said error information pointers are rearranged according to an arrangement sequence condition designated.

17. A timing error information managing method as defined in claim 14, wherein, when predetermined processing is conducted through the use of said set of error information pointers in said timing error selection information, said error information pointers are rearranged according to an arrangement sequence condition designated.

18. A timing error information managing method as defined in claim 13, wherein, upon a receipt of a timing error retrieval request, a retrieval condition involved in said retrieval request is compared with a retrieval condition in said timing error selection information already retained, and if said timing error selection information containing a retrieval condition including said retrieval condition involved in said retrieval request is retained, a retrieval under said retrieval condition involved in said retrieval request is conducted on timing error information indicated by an error information pointer in said timing error selection information.

19. A timing error information managing method as defined in claim 18, wherein, when predetermined processing is conducted through the use of said set of error information pointers in said timing error selection information, said error information pointers are rearranged according to an arrangement sequence condition designated.

20. A timing error information managing method as defined in claim 13, wherein, when predetermined processing is conducted through the use of said set of error information pointers in said timing error selection information, said error information pointers are rearranged according to an arrangement sequence condition designated.

21. A timing error information managing method as defined in claim 13, wherein timing error selection information in which a correlation is established between a sum condition of retrieval conditions in a plurality of timing error selection information already retained and a sum set of error information pointers in said plurality of timing error selection information is drawn up as a retrieval result under said sum condition.

22. A timing error information managing method as defined in claim 13, wherein timing error selection information in which a correlation is established between a product condition of retrieval conditions in a plurality of timing error selection information already retained and a product set of error information pointers in said plurality of timing error selection information is drawn up as a retrieval result under said product condition.

23. A timing error information managing system for managing information on timing errors located through a timing check of a circuit, comprising:
    a timing error information file storing said information on said timing errors;
    a circuit information file storing information on configurations of said circuit;
    a correlating section for establishing a correlation between each of said timing errors in said timing error information file and each of said circuit configurations in said circuit information file, and for adding, to said timing error information file, a circuit information pointer for giving an instruction regarding a position of the storage of said information on said circuit configuration, causing the occurrence of each of said timing errors, in said circuit information file and further for adding, to said circuit information file, an error information pointer for giving an instruction regarding a position of the storage of said information on said timing error, occurring in each of said circuit configurations, in said timing error information file; and
    a managing section for managing said information on said timing errors through the use of said circuit information pointer and said error information pointer.

24. A timing error information managing system as defined in claim 23, wherein said circuit information file includes a data signal path information file storing, as said circuit configuration, information on a data signal path for transmission of a data signal among elements constituting said circuit and a clock path information file storing, as said circuit configuration, information on a clock path for supply of a clock to each of said elements constituting said circuit, and said correlating section adds said error information pointer to each of said data signal path information file and said clock path information file.

25. A timing error information managing system as defined in claim 24, wherein, when receiving a request for a timing error retrieval under a predetermined retrieval condition, said managing section refers to said circuit information file and said timing error information file to execute said timing error retrieval meeting said predetermined retrieval condition, and establishes a correlation between said predetermined retrieval condition and a set of error information pointers indicating said timing errors retrieved by said managing section under said predetermined retrieval condition to retain said correlation as timing error selection information in a retaining section.

26. A timing error information managing system as defined in claim 25, wherein, when receiving a timing error retrieval request, said managing section compares a retrieval condition involved in said retrieval request with a retrieval condition in said timing error selection information retained in said retaining section, and if said timing error selection information containing said retrieval condition identical to said retrieval condition involved in said retrieval request is retained in said retaining section, outputs a set of error information pointers in said timing error selection information as a result of a retrieval meeting said retrieval request.

27. A timing error information managing system as defined in claim 26, wherein, when receiving a timing error retrieval request, said managing section compares a retrieval condition involved in said retrieval request with a retrieval condition in said timing error selection information retained in said retaining section, and if said timing error selection information containing said retrieval condition including said retrieval condition involved in said retrieval request is retained in said retaining section, performs a retrieval, under said retrieval condition involved in said retrieval request, on timing error information indicated by an error information pointer in said timing error selection information.

28. A timing error information managing system as defined in claim 27, wherein, when conducting predetermined processing through the use of said set of error information pointers in said timing error selection information, said managing section rearranges said error information pointers according to an arrangement sequence condition designated.

29. A timing error information managing system as defined in claim 26, wherein, when conducting predetermined processing through the use of said set of error information pointers in said timing error selection information, said managing section rearranges said error information pointers according to an arrangement sequence condition designated.

30. A timing error information managing system as defined in claim 25, wherein, when receiving a timing error retrieval request, said managing section compares a retrieval condition involved in said retrieval request with a retrieval condition in said timing error selection information retained in said retaining section, and if said timing error selection information containing said retrieval condition including said retrieval condition involved in said retrieval request is retained in said retaining section, performs a retrieval, under said retrieval condition involved in said retrieval request, on timing error information indicated by an error information pointer in said timing error selection information.

31. A timing error information managing system as defined in claim 30, wherein, when conducting predetermined processing through the use of said set of error information pointers in said timing error selection information, said managing section rearranges said error information pointers according to an arrangement sequence condition designated.

32. A timing error information managing system as defined in claim 25, wherein, when conducting predetermined processing through the use of said set of error information pointers in said timing error selection information, said managing section rearranges said error information pointers according to an arrangement sequence condition designated.

33. A timing error information managing system as defined in claim 25, wherein said managing section draws up timing error selection information in which a correlation is established between a sum condition of retrieval conditions in a plurality of timing error selection information retained in said retaining section and a sum set of error information pointers in said plurality of timing error selection information, as a retrieval result under said sum condition.

34. A timing error information managing system as defined in claim 25, wherein said managing section draws up timing error selection information in which a correlation is established between a product condition of retrieval conditions in a plurality of timing error selection information retained in said retaining section and a product set of error information pointers in said plurality of timing error selection information, as a retrieval result under said product condition.

35. A timing error information managing system as defined in claim 23, wherein, when receiving a request for a timing error retrieval under a predetermined retrieval condition, said managing section refers to said circuit information file and said timing error information file to execute said timing error retrieval meeting said predetermined retrieval condition, and establishes a correlation between said predetermined retrieval condition and a set of error information pointers indicating said timing errors retrieved by said managing section under said predetermined retrieval condition to retain said correlation as timing error selection information in a retaining section.

36. A timing error information managing system as defined in claim 35, wherein, when receiving a timing error retrieval request, said managing section compares a retrieval condition involved in said retrieval request with a retrieval condition in said timing error selection information retained in said retaining section, and if said timing error selection information containing said retrieval condition identical to said retrieval condition involved in said retrieval request is retained in said retaining section, outputs a set of error information pointers in said timing error selection information as a result of a retrieval meeting said retrieval request.

37. A timing error information managing system as defined in claim 36, wherein, when receiving a timing error retrieval request, said managing section compares a retrieval condition involved in said retrieval request with a retrieval condition in said timing error selection information retained in said retaining section, and if said timing error selection information containing said retrieval condition including said retrieval condition involved in said retrieval request is retained in said retaining section, performs a retrieval, under said retrieval condition involved in said retrieval request, on timing error information indicated by an error information pointer in said timing error selection information.

38. A timing error information managing system as defined in claim 37, wherein, when conducting predetermined processing through the use of said set of error information pointers in said timing error selection information, said managing section rearranges said error information pointers according to an arrangement sequence condition designated.

39. A timing error information managing system as defined in claim 36, wherein, when conducting predetermined processing through the use of said set of error information pointers in said timing error selection information, said managing section rearranges said error information pointers according to an arrangement sequence condition designated.

40. A timing error information managing system as defined in claim 35, wherein, when receiving a timing error retrieval request, said managing section compares a retrieval condition involved in said retrieval request with a retrieval condition in said timing error selection information retained in said retaining section, and if said timing error selection information containing said retrieval condition including said retrieval condition involved in said retrieval request is retained in said retaining section, performs a retrieval, under said retrieval condition involved in said retrieval request, on timing error information indicated by an error information pointer in said timing error selection information.

41. A timing error information managing system as defined in claim 40, wherein, when conducting predetermined processing through the use of said set of error information pointers in said timing error selection information, said managing section rearranges said error information pointers according to an arrangement sequence condition designated.

42. A timing error information managing system as defined in claim 35, wherein, when conducting predetermined processing through the use of said set of error information pointers in said timing error selection information, said managing section rearranges said error information pointers according to an arrangement sequence condition designated.

43. A timing error information managing system as defined in claim 35, wherein said managing section draws up timing error selection information in which a correlation is established between a sum condition of retrieval conditions in a plurality of timing error selection information retained in said retaining section and a sum set of error information pointers in said plurality of timing error selection information, as a retrieval result under said sum condition.

44. A timing error information managing system as defined in claim 35, wherein said managing section draws up timing error selection information in which a correlation is established between a product condition of retrieval conditions in a plurality of timing error selection information retained in said retaining section and a product set of error information pointers in said plurality of timing error selection information, as a retrieval result under said product condition.

* * * * *